US006812797B1

(12) United States Patent
De Veirman et al.

(10) Patent No.: US 6,812,797 B1
(45) Date of Patent: Nov. 2, 2004

(54) PHASE-LOCKED LOOP WITH LOOP SELECT SIGNAL BASED SWITCHING BETWEEN FREQUENCY DETECTION AND PHASE DETECTION

(75) Inventors: Geert Adolf De Veirman, Corona del Mar, CA (US); Mehmet Ali Tan, Irvine, CA (US); Xinyu Chen, Irvine, CA (US)

(73) Assignee: Agere Systems Inc., Allentown, PA (US)

(*) Notice: Subject to any disclaimer, the term of this patent is extended or adjusted under 35 U.S.C. 154(b) by 0 days.

(21) Appl. No.: 10/452,657

(22) Filed: May 30, 2003

(51) Int. Cl.$^7$ ............................................. H03L 7/087

(52) U.S. Cl. .............................. 331/11; 331/17; 331/25; 327/156; 327/157

(58) Field of Search .......................... 331/1 A, 10–12, 331/16–18, 25, DIG. 2; 327/156–159; 332/127; 360/51; 375/376; 455/260

(56) References Cited

U.S. PATENT DOCUMENTS 4,542,351 A * 9/1985 Okada ......................... 331/11

OTHER PUBLICATIONS

M. Burzio et al., "A High Speed 0.7$\mu$m CMOS PLL Circuit for Clock/Data Recovery in Interconnection Systems," ESSCIRC, '96 Proceedings of the 22nd European Solid–State Circuits Conference, 4 pages, 1996.
C.R. Hogge, "A Self Correcting Clock Recovery Circuit," IEEE Journal of Lightwave Technology, vol. LT–3. pp. 1312–1314, Dec. 1985.
Y. Tang et al., "A Non–sequential Phase Detector for PLL–based High–Speed Data/Clock Recovery," Proceedings of 2000 Midwest Symposium on Circuits and Systems, pp. 428–431, Aug. 2000.

* cited by examiner

Primary Examiner—David Mis

(57) ABSTRACT

A phase-locked loop (PLL) includes at least first and second loops, and loop selection circuitry coupled to the first and second loops, the loop selection circuitry being responsive to at least one loop select signal to control transition from an operating mode of one of the first and second loops to an operating mode of the other of the first and second loops. In an illustrative embodiment, the PLL comprises a dual-loop PLL with the first and second loops corresponding to respective frequency and phase loops, and the loop selection circuitry is configured such that the loop select signal as applied to a control input of a current-generating component of the first loop represents a delayed and inverted version of the loop select signal as applied to a control input of a current-generating component of the second loop.

18 Claims, 2 Drawing Sheets

PHASE-LOCKED LOOP WITH LOOP SELECT SIGNAL BASED SWITCHING BETWEEN FREQUENCY DETECTION AND PHASE DETECTION

FIELD OF THE INVENTION

The present invention relates generally to the field of electronic circuits, and more particularly to phase-locked loops (PLLs).

BACKGROUND OF THE INVENTION

One important application of PLLs is in clock recovery circuits. As is well known, such clock recovery circuits are commonly implemented in integrated circuits used in a wide variety of electronic systems, including communication systems, interconnection systems and data storage systems.

It is also known that PLLs used for clock recovery applications may be configured to include two related loops, generally a frequency loop and a phase loop. The frequency loop is responsible for clock signal frequency acquisition, and is designed to bring the clock signal frequency into the lock-in range of the phase loop, while the phase loop is responsible for the phase locking of the clock signal with an incoming data signal. Such PLLs are typically referred to as dual-loop PLLs, and also find application outside of the clock recovery context.

An example of a conventional dual-loop PLL is described in M. Burzio et al., "A high speed 0.7 μm CMOS PLL circuit for clock/data recovery in interconnection systems," ESS-CIRC '96 Proceedings of the 22nd European Solid-State Circuits Conference, which is incorporated by reference herein.

It is generally desirable in a dual-loop PLL that the process of switching from frequency detection using the frequency loop to phase detection using the phase loop be as smooth as possible, in order to prevent any discontinuity in loop filter state.

One previous attempt to address this issue involves keeping both loops on all the time. However, this approach can result in the injection of noise into the phase loop, thereby increasing jitter. It may also create stability problems.

Another approach to providing smooth switching from frequency detection to phase detection involves multiplexing the outputs of the frequency and phase detectors associated with the respective frequency and phase loops. However, loading problems associated with this multiplexing approach generally require the use of high-speed output circuits for one or both of the frequency and phase detectors. As a result, the circuit area and power consumption requirements of the dual-loop PLL are unduly increased.

It is therefore apparent that a need exists for an improved dual-loop PLL which can provide smooth switching from frequency detection to phase detection without the problems associated with the above-described conventional techniques.

SUMMARY OF THE INVENTION

The present invention provides an improved phase-locked loop (PLL) which in an illustrative embodiment provides loop select signal based switching between a first loop associated with frequency detection and a second loop associated with phase detection.

In accordance with one aspect of the invention, a PLL includes at least first and second loops, and loop selection circuitry coupled to the first and second loops. The loop selection circuitry is responsive to at least one loop select signal to control transition from an operating mode of one of the first and second loops to an operating mode of the other of the first and second loops.

The first and second loops may be coupled together such that the loops share at least one loop component. For example, the loops may be coupled so as to share a series combination of a signal combiner, a loop filter and a voltage-controlled oscillator.

The loop selection circuitry is preferably configured so as to provide a time interval for which the respective operating modes of the first and second loops both remain enabled prior to disabling of the operating mode of the first loop, and a time interval for which the respective operating modes of the first and second loops both remain disabled prior to enabling of the operating mode of the first loop.

In an illustrative embodiment, the PLL comprises a dual-loop PLL with the first and second loops corresponding to respective frequency and phase loops, and the loop selection circuitry is configured such that the loop select signal as applied to a control input of a current-generating component of the frequency loop represents a delayed and inverted version of the loop select signal as applied to a control input of a current-generating component of the phase loop. The current-generating components of the frequency and phase loops may comprise charge pumps.

The loop selection circuitry in the illustrative embodiment comprises a series combination of a delay element and an inverter, with the delay element configured to provide a delay on the order of approximately 100 nanoseconds. The loop select signal is applied via the series combination of the delay element and the inverter to a control input of the charge pump of the frequency loop, and is further applied to a control input of a corresponding charge pump of the phase loop. The loop select signal in the illustrative embodiment is thus utilized to control the enabling and disabling of the charge pumps of the frequency and phase loops.

A PLL in accordance with the invention may be implemented, for example, as a portion of an integrated circuit. As a more particular example, the PLL may be implemented as a component of a clock recovery circuit which is itself implemented as a portion of an integrated circuit.

Advantageously, the present invention in the illustrative embodiment provides a particularly efficient mechanism for smooth switching from frequency detection to phase detection in a dual-loop PLL. Moreover, the illustrative embodiment avoids the difficulties associated with the conventional techniques described above.

DETAILED DESCRIPTION OF THE INVENTION

The present invention will be illustrated below in conjunction with an exemplary embodiment of a dual-loop PLL with loop select signal based switching between a first loop associated with frequency detection and a second loop associated with phase detection. It should be understood, however, that the invention is not limited to use with the particular circuitry arrangements of the illustrative embodiment, and other embodiments may include, for example, different types and numbers of loops, different loop selection circuitry configurations, different loop select signal timing, etc.

Figure 1:
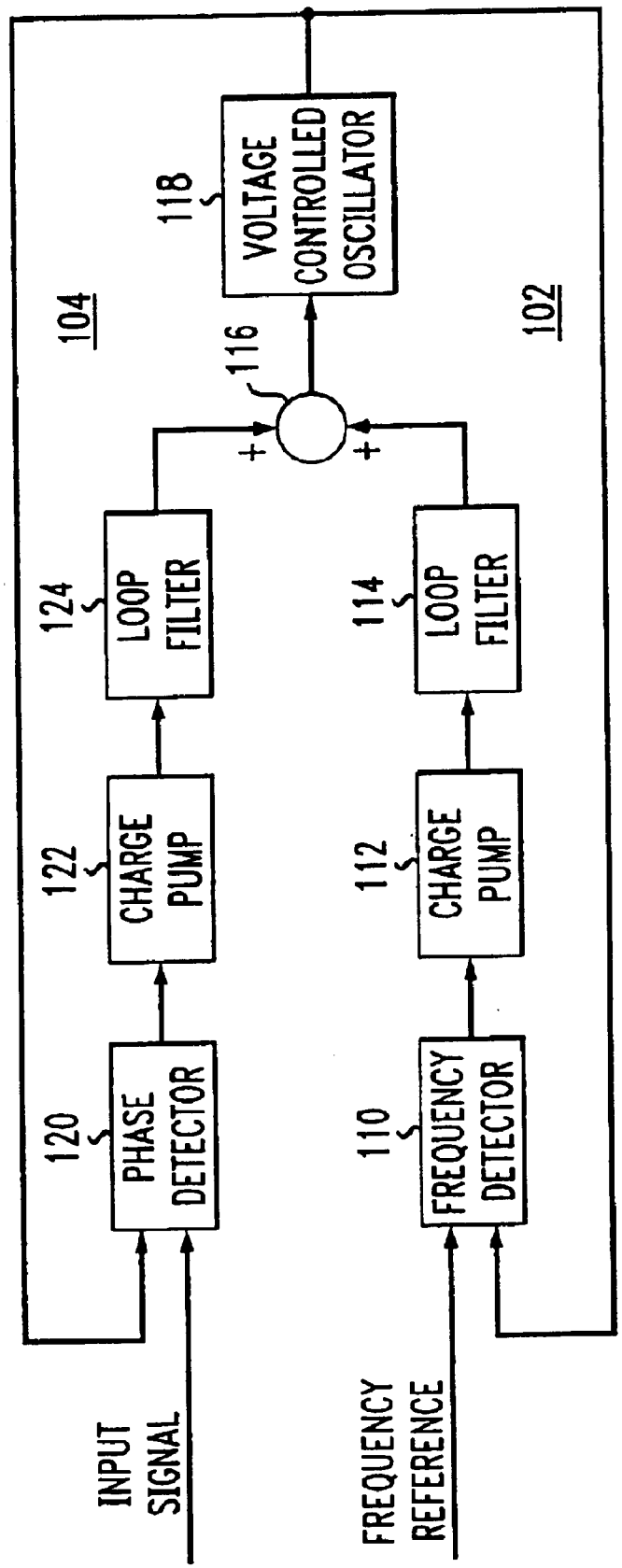
FIG. 1 is a schematic diagram of an example dual-loop PLL that may be configured to provide loop select signal based switching between frequency detection and phase detection in accordance with the invention.

FIG. 1 shows an example of a dual-loop PLL 100 in which the present invention may be implemented. The dual-loop PLL 100 includes a first loop 102 corresponding to a frequency loop and a second loop 104 corresponding to a phase loop.

The frequency loop 102 includes a frequency detector 110, a charge pump 112, a loop filter 114, a signal combiner 116 and a voltage-controlled oscillator (VCO) 118. The frequency detector 110 receives as its inputs a frequency reference signal and an output of the VCO 118.

The phase loop 104 includes a phase detector 120, a charge pump 122, a loop filter 124, the signal combiner 116 and the VCO 118. The phase detector 120 receives as its inputs an input signal and an output of the VCO 118. For example, in a clock recovery application, the input signal may comprise a data signal to which a clock signal is to be phase locked.

The phase detector 120 is preferably a linear phase detector of the type described in U.S. Patent Application Ser. No. 10/452,661, entitled "Reduced Complexity Linear Phase Detector," which is filed concurrently herewith and incorporated by reference herein.

As is apparent from the figure, the frequency loop 102 and phase loop 104 are coupled together so as to share a number of loop components, including in this example a series combination of the signal combiner 116 and the VCO 118. Other types of loop coupling arrangements may be used in other embodiments.

Generally, the frequency loop 102 provides frequency acquisition of the frequency reference signal, and the phase loop 104 provides phase locking of the input signal to the acquired frequency reference signal. Conventional aspects of the operation of these loops and their associated components are well-known in the art, and therefore not further described herein.

Figure 2:
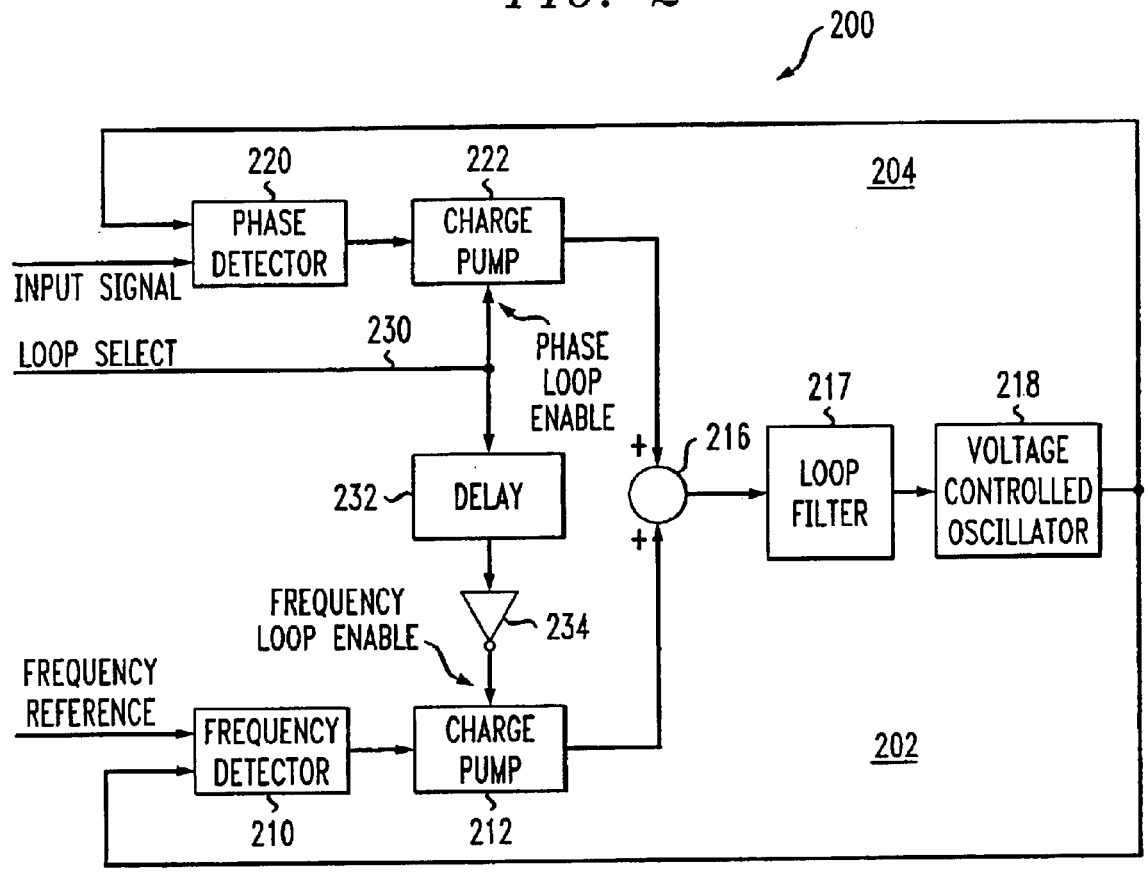
FIG. 2 is a schematic diagram showing the manner in which the FIG. 1 dual-loop PLL may be configured to include loop select signal based switching between frequency detection and phase detection in accordance with the invention.

FIG. 2 shows a dual-loop PLL 200 which corresponds generally to the dual-loop PLL 100 of FIG. 1 as configured in accordance with the illustrative embodiment of the invention to include loop select signal based switching between frequency detection and phase detection.

The dual-loop PLL 200 includes a first loop 202 corresponding to a frequency loop and a second loop 204 corresponding to a phase loop.

The frequency loop 202 includes a frequency detector 210, a charge pump 212, a signal combiner 216, a loop filter 217 and a VCO 218. The frequency detector 210 receives as its inputs a frequency reference signal and an output of the VCO 218.

The phase loop 204 includes a phase detector 220, a charge pump 222, the signal combiner 216, the loop filter 217 and the VCO 218. The phase detector 220 receives as its inputs an input signal and an output of the VCO 118. As in the FIG. 1 dual-loop PLL, the phase detector 220 is preferably a linear phase detector of the type described in the above-cited U.S. patent application Ser. No. 10/452,661.

The frequency loop 202 and phase loop 204 are coupled together so as to share a number of loop components, including in this example a series combination of the signal combiner 216, the loop filter 217 and the VCO 218.

Like the corresponding loops of the FIG. 1 dual-loop PLL, the frequency loop 202 provides frequency acquisition of the frequency reference signal, and the phase loop 204 provides phase locking of the input signal to the acquired frequency reference signal. Again, conventional aspects of the operation of these loops and their associated components are well-known in the art, and therefore not further described herein.

In accordance with one aspect of the invention, the dual-loop PLL 200 further includes loop selection circuitry coupled to the frequency loop 202 and the phase loop 204. Generally, the loop selection circuitry implemented in the dual-loop PLL 200 is responsive to at least one loop select signal to control a transition from an operating mode of one of the loops 202, 204 to an operating mode of the other of the loops 202, 204.

The loop selection circuitry in the illustrative embodiment comprises signal line 230, and a series combination of delay element 232 and inverter 234. A loop select signal is applied via the series combination of the delay element 232 and the inverter 234 to a control input of the charge pump 212 of the frequency loop 202. The loop select signal is further applied to a control input of the charge pump 222 of the phase loop 204.

A suitable amount of delay for the delay element 232 in the illustrative embodiment is on the order of approximately 100 nanoseconds, although other values may be used. The particular value used may vary depending upon implementation-specific factors, and can be determined in a straightforward manner given the teachings provided herein.

The charge pumps 212, 222 are examples of loop components more generally referred to herein as current-generating components. Other types of current-generating components may be used in place of one or both of the charge pumps 212, 222 in alternative embodiments.

The loop select signal is thus utilized to control the charge pumps 212, 222 of the respective frequency and phase loops 202, 204. The loop select signal as applied to the control input of the charge pump 212 represents a delayed and inverted version of the loop select signal as applied to the control input of the charge pump 222.

The above-noted control inputs of the charge pumps 212, 222 are also referred to herein as frequency loop enable and phase loop enable inputs, respectively. Each of the frequency loop enable and phase loop enable inputs may be viewed as receiving via the loop selection circuitry a different version of the loop select signal applied to signal line 230.

As is apparent from the figure, the illustrative embodiment is configured to switch between frequency detection using the frequency loop 202 and phase detection using the phase loop 204, by appropriate processing and application of a loop select signal to the charge pumps 212, 222. More particularly, a predetermined delay and inversion are implemented between the loop select signal as applied to the charge pump 212 and the loop select signal as applied to the charge pump 222. This approach ensures that the state of the loop filter remains substantially continuous during the transition. Since the switched signals in this embodiments are currents generated by the respective charge pumps 212, 222, the loading problems associated with the conventional multiplexing approach are avoided, as are the associated area and power penalties.

Figure 3:
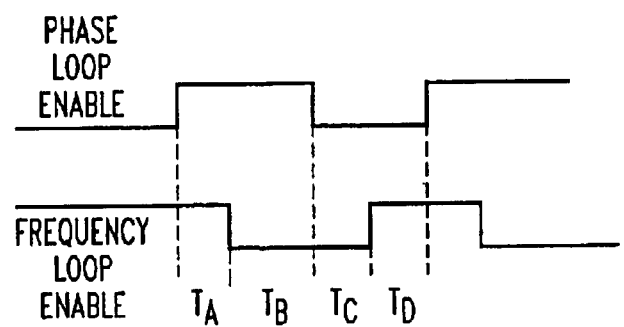
FIG. 3 is a timing diagram illustrating the relationship between phase loop enable and frequency loop enable signals generated from a common loop select signal in loop selection circuitry of the dual-loop PLL of FIG. 2.

FIG. 3 shows a timing diagram illustrating the relationship between signals applied to the frequency loop enable and phase loop enable inputs of the respective charge pumps 212, 222, as generated by the loop selection circuitry comprising signal line 230, delay element 232 and inverter 234. It can be seen that the frequency loop enable signal in this embodiment is a delayed and inverted version of the phase loop enable signal. The latter signal in this embodiment corresponds to the loop select signal applied to signal line 230. The frequency loop and phase loop enable signals may thus be viewed as different versions of the loop select signal.

The operation of the dual-loop PLL 200 typically starts with enabling the frequency loop and thereby locking the VCO frequency to the reference frequency signal which, as indicated previously, may be a clock signal. The phase loop is then enabled and the frequency loop disabled in order to phase lock a data signal or other input signal to the frequency-locked reference signal.

The loop select signal as processed by the loop selection circuitry and applied to the loop enable inputs of the respective charge pumps 212, 222 provides a time interval for which the respective operating modes of the frequency and phase loops 202, 204 both remain enabled prior to a subsequent disabling of the operating mode of the frequency loop 202. This is the time interval denoted as $T_A$ in FIG. 3. The time interval $T_A$ generally represents a predetermined overlap in the frequency and phase loop enable signals that is provided by the operation of the delay element 232 and inverter 234.

Such an arrangement ensures that the frequency loop is operative to maintain frequency acquisition for a sufficient amount of time during the enabling of the phase loop, before the frequency loop is subsequently disabled.

During the time period $T_B$, the operating mode of the frequency loop 202 is disabled, and the operating mode of the phase loop 204 is enabled.

The loop select signal as processed by the loop selection circuitry and applied to the loop enable inputs of the respective charge pumps 212, 222 also provides a time interval for which the respective operating modes of the frequency and phase loops 202, 204 both remain disabled prior to a subsequent re-enabling of the operating mode of the frequency loop 202. This is the time interval denoted as $T_c$ in FIG. 3.

This arrangement ensures that the normal operation of the frequency loop in obtaining frequency acquisition will not be interfered with by the phase loop.

During the time period $T_D$, the frequency loop performs its usual frequency acquisition operation.

Subsequent to expiration of the time period $T_D$, the above-described loop selection process may be repeated, as required.

The PLL 200 of FIG. 2 may be implemented, by way of example, as a component of an integrated circuit for use in a communication system, an interconnection system, a data storage system or other application. Such an integrated circuit may include many such PLLs, utilized in clock recovery circuits or other types of circuitry.

Advantageously, the present invention in the illustrative embodiment provides a particularly efficient mechanism for smooth switching from frequency detection to phase detection in a dual-loop PLL, which avoids the difficulties associated with the conventional techniques described above. For example, by performing the loop switching operation at the output of the charge pumps 212 and 222, the PLL 200 of FIG. 2 avoids the loading problems associated with the conventional detector output multiplexing approach. As mentioned previously, the transition from frequency detection to phase detection in the illustrative embodiment is preferably based on a predetermined time between frequency loop and phase loop select signals, and provides the desired smoothness without the problems of the prior art.

It should again be emphasized that the exemplary dual-loop PLL as described in conjunction with FIGS. 1, 2 and 3 is intended to illustrate the operation of the invention, and therefore should not be construed as limiting the invention to any particular embodiment or group of embodiments. Furthermore, it will be apparent to those skilled in the art that the particular PLL circuitry shown herein for purposes of illustrating the invention may be implemented in many different ways, and may include additional or alternative elements. For example, other types of loop select signals and loop selection circuitry may be used. Also, the techniques of the invention can be applied to PLLs having more than two distinct loops.

These and numerous other alternative embodiments within the scope of the following claims will therefore be apparent to those skilled in the art.

What is claimed is:

1. A phase-locked loop circuit comprising:
   a first loop;
   a second loop; and
   loop selection circuitry coupled to the first and second loops, the loop selection circuitry being responsive to at least one loop select signal to control a transition from an operating mode of one of the first and second loops to an operating mode of the other of the first and second loops.

2. The phase-locked loop circuit of claim 1 wherein said first loop comprises a frequency loop and said second loop comprises a phase loop.

3. The phase-locked loop circuit of claim 1 wherein the second loop is coupled with the first loop so as to share at least one loop component with the first loop.

4. The phase-locked loop circuit of claim 3 wherein said loop component shared between the first and second loops comprises a voltage-controlled oscillator.

5. The phase-locked loop circuit of claim 4 wherein said loop component shared between the first and second loops comprises a series combination of a signal combiner, a loop filter and the voltage-controlled oscillator.

6. The phase-locked loop circuit of claim 1 wherein said loop selection circuitry comprises a series combination of a delay element and an inverter.

7. The phase-locked loop circuit of claim 6 wherein the delay element is configured to provide a delay on the order of approximately 100 nanoseconds.

8. The phase-locked loop circuit of claim 6 wherein the loop select signal is applied via the series combination of the delay element and the inverter to a control input of a current-generating component of the first loop.

9. The phase-locked loop circuit of claim 8 wherein the loop select signal is further applied to a control input of a corresponding current-generating component of the second loop.

10. The phase-locked loop circuit of claim 9 wherein at least one of the current-generating components comprises a charge pump.

11. The phase-locked loop circuit of claim 1 wherein the loop select signal is utilized to control first and second current-generating components of the respective first and second loops.

12. The phase-locked loop circuit of claim 11 wherein the loop selection circuitry is configured such that the loop select signal as applied to a control input of the first current-generating component represents a delayed and inverted version of the loop select signal as applied to a control input of the second current-generating component.

13. The phase-locked loop circuit of claim 11 wherein the loop selection circuitry is configured such that the loop select signal as applied to control inputs of the respective first and second current-generating components provides a time interval for which the respective operating modes of the first and second loops both remain enabled prior to disabling of the operating mode of the first loop.

14. The phase-locked loop circuit of claim 11 wherein the loop selection circuitry is configured such that the loop select signal as applied to control inputs of the respective first and second current-generating components provides a time interval for which the respective operating modes of the first and second loops both remain disabled prior to enabling of the operating mode of the first loop.

15. The phase-locked loop circuit of claim 1 wherein said phase-locked loop circuit is implemented as a component of an integrated circuit.

16. The phase-locked loop circuit of claim 1 wherein said phase-locked loop circuit is implemented as a component of a clock recovery circuit.

17. A clock recovery circuit comprising:
   at least one phase-locked loop circuit;
   the phase-locked loop circuit comprising:
      a first loop;
      a second loop; and
      loop selection circuitry coupled to the first and second loops, the loop selection circuitry being responsive to at least one loop select signal to control a transition from an operating mode of one of the first and second loops to an operating mode of the other of the first and second loops.

18. An integrated circuit comprising a plurality of phase-locked loop circuits, at least a given one of the phase-locked loop circuits comprising:
   a first loop;
   a second loop; and
   loop selection circuitry coupled to the first and second loops, the loop selection circuitry being responsive to at least one loop select signal to control a transition from an operating mode of one of the first and second loops to an operating mode of the other of the first and second loops.

* * * * *